(12) United States Patent
Chung

(10) Patent No.: US 11,751,319 B2
(45) Date of Patent: Sep. 5, 2023

(54) ELECTRONIC DEVICE

(71) Applicant: SAMSUNG ELECTRONICS CO., LTD., Suwon-si (KR)

(72) Inventor: Hyunwoo Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 298 days.

(21) Appl. No.: 17/257,373

(22) PCT Filed: Mar. 21, 2019

(86) PCT No.: PCT/KR2019/003302
§ 371 (c)(1),
(2) Date: Dec. 31, 2020

(87) PCT Pub. No.: WO2020/022607
PCT Pub. Date: Jan. 30, 2020

(65) Prior Publication Data
US 2021/0136910 A1 May 6, 2021

(30) Foreign Application Priority Data
Jul. 25, 2018 (KR) .................. 10-2018-0086742

(51) Int. Cl.
*H05K 9/00* (2006.01)
*H05K 1/02* (2006.01)
(Continued)

(52) U.S. Cl.
CPC ......... *H05K 1/0216* (2013.01); *G02B 6/0051* (2013.01); *G02B 6/0088* (2013.01);
(Continued)

(58) Field of Classification Search
CPC ... H05K 9/0016; H05K 9/0033; H05K 9/0035
See application file for complete search history.

(56) References Cited

U.S. PATENT DOCUMENTS

| 6,235,986 B1 | 5/2001 | Reis et al. |
| 8,629,355 B2 | 1/2014 | Kwon et al. |

(Continued)

FOREIGN PATENT DOCUMENTS

| JP | 2017-531301 A | 10/2017 |
| KR | 20-2000-0009183 U | 5/2000 |

(Continued)

OTHER PUBLICATIONS

International Search Report (PCT/ISA/210) dated Jul. 9, 2019 by the International Searching Authority in International Patent Application No. PCT/KR2019/003302.
(Continued)

*Primary Examiner* — Hung V Ngo
(74) *Attorney, Agent, or Firm* — Sughrue Mion, PLLC

(57) ABSTRACT

An electronic device is disclosed. The disclosed electronic device includes a printed circuit board including at least one through-hole, a holder which is positioned through the through-hole and protrudes upward and downward from the printed circuit board, and a solder layer for bonding one area of the holder to one surface of the printed circuit board.

14 Claims, 7 Drawing Sheets

(51) Int. Cl.
*F21V 8/00* (2006.01)
*H05K 1/18* (2006.01)

(52) U.S. Cl.
CPC ........... *H05K 1/182* (2013.01); *H05K 9/0033* (2013.01); *H05K 2201/10189* (2013.01)

(56) References Cited

U.S. PATENT DOCUMENTS

| | | | |
|---|---|---|---|
| 10,001,592 B2 | 6/2018 | Oh et al. | |
| 10,219,382 B2 | 2/2019 | Joo et al. | |
| 10,439,317 B2 | 10/2019 | Horchler et al. | |
| 2007/0273807 A1 | 11/2007 | Yun | |
| 2007/0284142 A1 | 12/2007 | Jonker | |
| 2016/0072229 A1 | 3/2016 | Green et al. | |
| 2016/0135335 A1* | 5/2016 | Nakamura | H05K 9/0026 174/382 |
| 2017/0135200 A1* | 5/2017 | Chang | H05K 3/301 |

FOREIGN PATENT DOCUMENTS

| | | |
|---|---|---|
| KR | 10-2001-0042299 A | 5/2001 |
| KR | 10-2007-0113838 A | 11/2007 |
| KR | 10-2009-0083095 A | 8/2009 |
| KR | 10-2011-0073663 A | 6/2011 |
| KR | 10-1732518 B1 | 5/2017 |
| WO | 2015/076592 A1 | 5/2015 |
| WO | 2015/156591 A1 | 10/2015 |

OTHER PUBLICATIONS

Written Opinion (PCT/ISA/237) dated Jul. 9, 2019 by the International Searching Authority in International Patent Application No. PCT/KR2019/003302.

Communication dated Jan. 12, 2023 by the Korean Intellectual Property Office in Korean Patent Application No. 10-2018-0086742.

* cited by examiner

ELECTRONIC DEVICE

TECHNICAL FIELD

The disclosure relates to an electronic apparatus in which a holder is mounted on a printed circuit board.

BACKGROUND ART

When manufacturing an electronic product in general, there are many cases that a second member is fixed on a top of a first member, and a certain distance is spaced between the first member and the second member, or the first member and the second member must be electrically connected.

For example, in a display, at least one holder supporting a diffuser plate may be disposed between a light guide plate and the diffuser plate such that the light guide plate and the diffuser plate are spaced apart by a predetermined optical distance. In addition, a holder may be used to electrically connect a shield cover and a printed circuit board disposed in the display.

The holder may be formed to protrude upward and downward from the printed circuit board. The holder is fixed to a through-hole of the printed circuit board by manually inserting. Therefore, it takes a lot of time and manpower to fix the holder to the printed circuit board.

DETAILED DESCRIPTION OF THE INVENTION

Technical Problem

According to an embodiment, since the holder can be coupled to the printed circuit board by automatically inserting, it is possible to provide an electronic apparatus that facilitates fixing the holder to the printed circuit board.

Technical Solution

According to an embodiment, an electronic apparatus includes a printed circuit board including at least one through-hole, a holder which is positioned through the through-hole and protrudes upward and downward from the printed circuit board, and a solder layer configured to bond one area of the holder to one surface of the printed circuit board.

The holder may be configured to be automatically inserted into the printed circuit board and fixed onto a surface of the printed circuit board.

The holder may be configured to include one surface extended to a periphery of the through-hole to be bonded to the solder layer.

The holder may be configured to include a lower holder configured to pass through the through-hole to be disposed on a lower portion of the printed circuit board, and protrude downward from the printed circuit board, an upper holder configured to protrude upward from the printed circuit board, and a connecting member configured to have a wider width compared to a diameter of the through-hole and connect the upper holder and the lower holder.

The solder layer may be configured to be interposed between one surface of the printed circuit board and the connecting member.

The connecting member may be configured to cover the solder layer formed on a periphery of the through-hole.

The connecting member may be configured to include a cover area corresponding to a size of the through-hole, and an extended area which covers a portion of the printed circuit board by being extended from the cover area, and wherein the solder layer is configured to contact with a lower end of the extended area.

The connecting member may be configured to have a disk shape, and wherein the lower holder is configured to protrude toward the through-hole from a center of the connecting member.

The upper holder may be configured to be disposed to be spaced apart from the lower holder passing through the through-hole by a predetermined distance.

The holder may be configured to be made of plastic, silicone, or rubber.

The printed circuit board may be configured to include a light guide plate disposed behind a display panel to guide the light to the display panel, wherein the upper holder is configured to support a diffuser plate disposed between the display panel and the light guide plate.

The holder may be configured to be made of an electrically conductive material.

The printed circuit board may include a shield cover for shielding electromagnetic waves of mounted electronic components, wherein the shield cover includes a first cover provided on an upper portion of the printed circuit plate, and a second cover provided on a lower portion of the printed circuit plate, wherein an inner surface of the first cover is configured to contact with the upper holder, wherein an inner surface of the second cover is configured to contact with the lower holder, and wherein the holder is configured to electronically connect the first cover and the second cover.

The solder layer may be configured to be electronically connected to a grounding pad of the printed circuit board.

The solder layer may be made of conductive epoxy.

MODE FOR IMPLEMENTING THE DISCLOSURE

Figure 1:
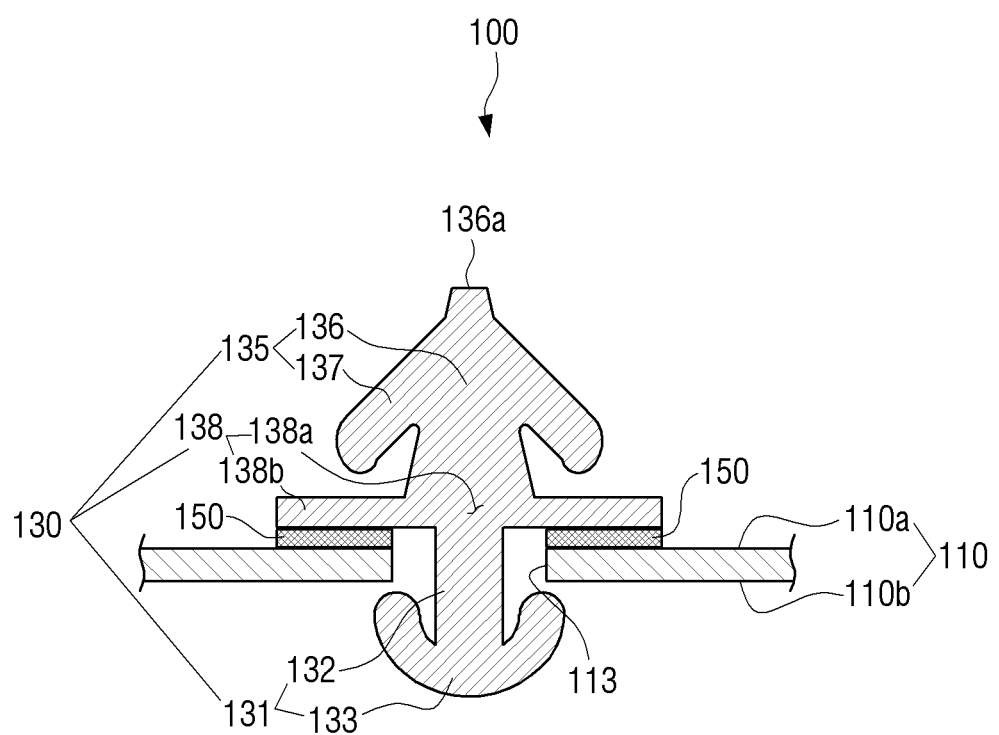
FIG. 1 is a cross section view illustrating an electronic apparatus according to an embodiment.

Hereinafter, exemplary embodiments of the disclosure will be described in detail with reference to accompanying drawings. The embodiments explained hereinafter will be explained based on the embodiments that are suitable for understanding the technical characteristics of the disclosure, and the technical characteristics of the disclosure are not limited by the embodiments, but exemplify that the disclosure may be realized as in the embodiments being explained.

Therefore, the disclosure may be modified in various ways with the technical scope of the disclosure, and such modified embodiments will be within the technical scope of the disclosure. Further, regarding the reference numerals disclosed in drawings attached to help understand the embodiments to be explained hereinafter, like reference numerals refer to like components.

FIG. 1 is a cross section view illustrating an electronic apparatus according to an embodiment.

Referring to FIG. 1, the electronic apparatus 100 may include a printed circuit board 110 and a holder 130 fixedly coupled to the printed circuit board 110. The holder 130 may be fixed to an upper portion of the printed circuit board 110 by auto-insert.

Various electronic apparatuses may be mounted on the printed circuit board 110. Electronic apparatuses may be mounted on both sides of the printed circuit board 110.

The printed circuit board 110 may include a second surface 110B that mounts at least one electronic apparatus and faces downward of the printed circuit board, and a first surface 110A, formed an opposite side of the second surface 110B, that mounts at least one electronic apparatus and faces upward of the printed circuit board.

The printed circuit board 110 may include a through-hole 113 through which at least one holder 130 passes. The through-hole 113 may be formed through the printed circuit board 110.

A plurality of through-holes 113 may be formed on the printed circuit board 110. The through-holes 113 may be disposed on the printed circuit board 110 at predetermined intervals. In addition, the plurality of holders 130 may be inserted and coupled to the plurality of through-holes 113 formed in the printed circuit board 110, respectively.

The holder 130 may be positioned through the through-hole 113 and may protrude upward and downward from the printed circuit board 110, respectively. The holder 130 may include a lower holder 131, an upper holder 135 and a connecting member 138.

The lower holder 131 may be inserted and coupled to the through-hole 113 of the printed circuit board 110, and the holder 130 may be coupled to the printed circuit board 110. The lower holder 131 may protrude from the second surface 110B that is the lower surface of the printed circuit board 110.

The upper holder 135 may be formed to protrude from the first surface 110A that is the upper surface of the printed circuit board 110.

A connecting member 138 may connect the upper holder 135 and the lower holder 131. Specifically, the upper holder 135 may be formed to protrude upward from the connecting member 138, and the lower holder 131 may be formed to protrude downward from the connecting member 138.

A width of the connecting member 138 may be wider than a diameter of the through-hole 113. The connecting member 138 may be coupled to the upper portion of the through-hole 113 and may be in contact with the first surface 110A of the printed circuit board 110 to cover a periphery of the through-hole 113 through which the lower holder 131 passes.

The connecting member 138 may include a cover area 138A facing the through-hole 113 and an extended area 138B that extends from the cover area 138A.

The cover area 138A may be formed as an area positioned above the through-hole 113. The cover area 138A may be formed to correspond to a size of the through-hole 113 and may be formed to cover a part of the through-hole 113. The cover area 138A may connect the lower holder 131 and the upper holder 135.

The extended area 138B may be formed to cover a part of the surface of the printed circuit board 110. The extended area 138B may be formed to cover the solder layer 150.

The extended area 138B may be formed to extend to the periphery of the through-hole 113 and may include a surface bonded to the solder layer 150. The solder layer 150 may be interposed between the lower surface of the extended area 138B and the first surface 110A of the printed circuit board 110. An area of the extended area 138B facing the printed circuit board 110 may be formed parallel to the printed circuit board 110 so as to be bonded to the solder layer 150.

The lower holder 131, the upper holder 135 and the connecting member 138 constituting the holder 130 may be integrally formed, and the lower holder 131, the upper holder 135 and the connecting member 138 may be made of a plastic material, a silicone material, a synthetic resin material, or an electrically conductive material.

The material of the holder 130 may be made variously depending on the use. Specifically, when the holder 130 supports a member that does not need to be disassembled again once it is fixed, the holder 130 may be made of a plastic material, and when the holder 130 supports a member that absorbs vibration or the like, or supports a member fixed to a portion with a tolerance, the holder 130 may be made of a silicon material. In addition, when the holder 130 is used for electrical connection, the holder 130 may be made of an electrically conductive material.

The electronic apparatus 100 may include a solder layer 150 interposed between the holder 130 and the printed circuit board 110 to couple the holder 130 and the printed circuit board 110.

The solder layer 150 may bond one area of the holder 130 to one surface of the printed circuit board 110. Specifically, the solder layer 150 may be disposed below the connecting member 138 of the holder 130, and may be disposed on the periphery of the through-hole 113 of the printed circuit board 110. The solder layer 150 may be disposed on one surface facing the connecting member 138 of the printed circuit board 110 and may contact with the lower surface of the connecting member 138.

The solder layer 150 may be formed by applying solder powder or solder paste. Alternatively, the solder layer 150 may be formed by attaching a solder sheet. The solder layer 150 may be made of a conductive epoxy.

The material forming the solder layer 150 may be, for example, tin, lead, and a mixed metal thereof.

The solder layer 150 may be formed by a process of sequentially melting and curing the solder after interposing solder between the connecting member 138 of the holder 130 and the printed circuit board 110.

The holder 130 may be stably bonded to the printed circuit board 110 by the solder layer 150.

In order to mount the holder 130 on the printed circuit board 110, the lower holder 131 protruding below the connecting member 138 is inserted into the through-hole 113 of the printed circuit board 110 and fixed. In this case, inserting and fixing the lower holder 131 into the through-hole 113 may be performed by auto-insert. The connecting member 138 of the holder 130 may be connected to the first surface 110A of the printed circuit board 110 using a surface mount technology.

The holder 130 according to an embodiment may be simply fixed to the upper surface of the printed circuit board 110 by auto-insert, and may be electrically or physically connected to the printed circuit board 110 using the surface mount technique. Therefore, the operation of fixing the holder 130 to the printed circuit board 110 is set to be simple.

Hereinafter, the shape of the holder 130 shown in FIG. 1 will be described in detail.

The lower holder 131 may penetrate through the printed circuit board 110 and be inserted into and coupled to a fixing member (not shown) positioned under the printed circuit board 110. The lower holder 131 may include an insertion protrusion 132 and a plurality of fitting members 133.

The insertion protrusion 132 may be coupled to the lower portion of the connecting member 138 and be inserted into the through-hole 113 of the printed circuit board 110.

The plurality of fitting members 133 may be disposed along a circumference of the insertion protrusion 132 on an outer circumferential surface of the insertion protrusion 132. The plurality of fitting members 133 may be fitted and coupled to a fixing member (not shown) formed at the lower end of the printed circuit board 110.

Since the lower holder 131 is inserted and coupled to the printed circuit board 110, the holder 130 may stably support other members while being fixed to the printed circuit board 110.

The upper holder 135 may protrude from the connecting member 138 in a direction opposite to the lower holder 131. The upper holder 135 may be supported by the connecting member 138.

The upper holder 135 may include a support protrusion 136 coupled to the connecting member 138 and an arcuate absorbing portion 137 coupled to the support protrusion 136. The support protrusion 136 may be formed to have a narrower width from the connecting member 138 toward the upper side. A support surface 136A formed flat to support other members may be formed at the upper end of the support protrusion 136.

The lower holder 131 and the upper holder 135 may protrude upward and downward from a center of the connecting member 138, respectively.

The connecting member 138 may be disposed between the lower holder 131 and the upper holder 135.

The connecting member 138 may be formed to extend to the periphery of the through-hole 113 while bonding to the first surface 110A of the printed circuit board 110.

The connecting member 138 may have a plate shape parallel to the printed circuit board 110. The connecting member 138 may be formed in a rectangular shape having a length greater than the diameter of the through-hole 113, and the connecting member 138 may have a disk shape having a diameter larger than the diameter of the through-hole 113.

The holder 130 may be formed in various ways according to its use. The shape of the holder 130 shown in FIG. 1 corresponds to an embodiment, and the shape of the holder 130 is not limited thereto, and the holder 130 may be formed to protrude upward and downward from the printed circuit board 110, respectively.

Figure 2:
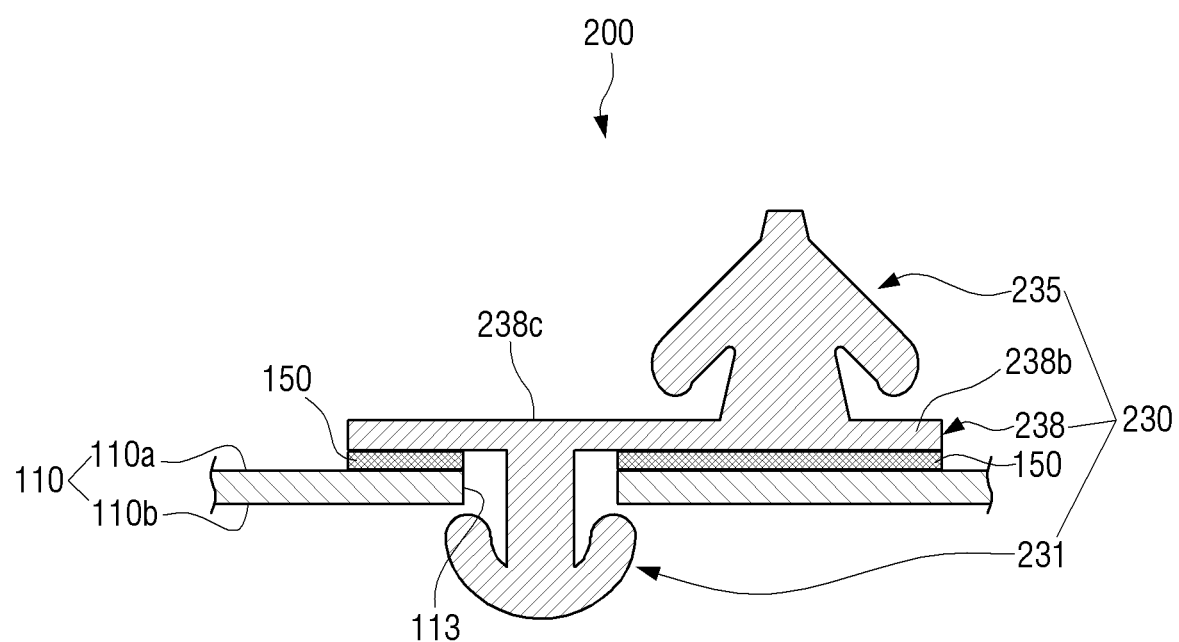
FIG. 2 is a cross section view illustrating an electronic apparatus according to another embodiment of the disclosure.

FIG. 2 is a cross section view illustrating an electronic apparatus according to another embodiment of the disclosure.

As illustrated in FIG. 2, an electronic apparatus 200 according to another embodiment of the disclosure may include a holder 230 fixedly coupled to a printed circuit board 110 and a printed circuit board 110. The holder 230 may be fixed to an upper surface of the printed circuit board 110 by auto-insert. The holder 230 includes a lower holder 231, an upper holder 235 and a connecting member 238.

However, since shapes of the lower holder 231 and the upper holder 235 are the same as the shapes of the lower holder 131 and the upper holder 135 according to the embodiment of the disclosure illustrated in FIG. 1, duplicate descriptions are omitted. Hereinafter, a position and function of the upper holder 235 according to another embodiment of the disclosure will be described.

The lower holder 231 may be formed to protrude from the connecting member 238 toward the through-hole 113. The upper holder 235 may be formed to protrude from the connecting member 238 toward an opposite direction of the lower holder 231 and may be disposed to be spaced apart from the lower holder 231 by a predetermined interval.

When the connecting member 238 has a disk shape, the upper holder 235 and the lower holder 231 may be eccentrically disposed from a center of the connecting member 238. The upper holder 235 may be formed at a position corresponding to a support position of a member supported by the upper holder 235. As the upper holder 235 is spaced apart from the lower holder 231, the holder 230 may support members having various support positions.

The connecting member 238 may be extended to cover the upper holder 235 and the solder layer 150. The extended area 238B of the connecting member 238 may be formed to cover a part of a surface of the printed circuit board 110. The extended area 238B may be formed to cover the solder layer 150.

The extended area 238B may be extended to a periphery of the through-hole 113 and may be extended to support the upper holder 235 at the top.

The connecting member 238 may include a flat surface 238C formed flat on the opposite surface of the lower holder 231. In a process that the holder 230 is fixed to the printed circuit board 110 by auto-insert, a transfer device for transferring the holder 230 to the printed circuit board 110 may adsorb the flat surface 238C and transfer the holder 230 to the through-hole 113 of the printed circuit board 110. The flat surface 238C may facilitate the transfer of the holder 230 protruding upward and downward.

Hereinafter, a case where the holder 230 is applied to a display device corresponding to an embodiment of a case for supporting a member will be described.

The display device described below is a device capable of processing an image signal received from the outside and visually displaying the processed image, and may be implemented in various forms such as a television, a monitor, a portable multimedia device, a portable communication device, or the like. Any device that visually displays an image is not limited thereto.

A backlight unit may be classified into an edge-lit type that irradiates light to a side of a light guide plate in which a light source is disposed at a rear of a display panel, and uniformly guides the light incident on the light guide plate to the display panel through the light guide plate, and a direct-lit type that the light source is disposed at the rear of the display panel and directly irradiates the light to the display panel.

Figure 3:
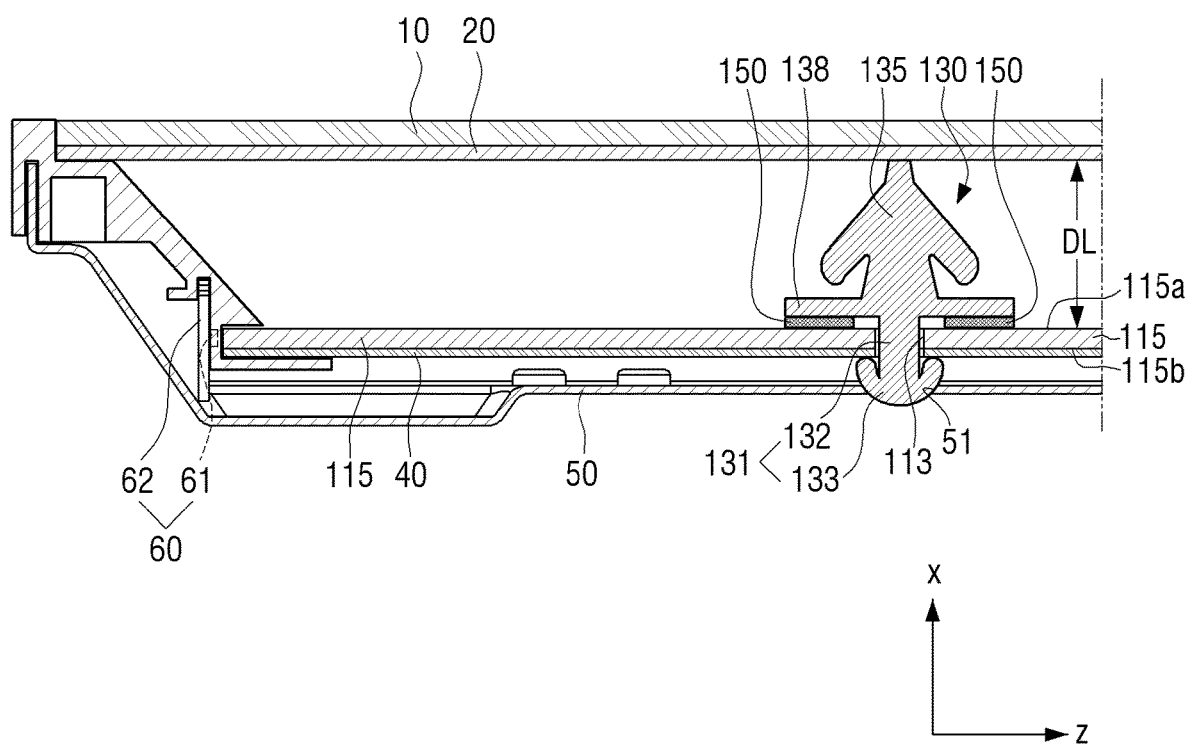
FIG. 3 is a cross section view illustrating a case where an electronic apparatus is applied to a display device including an edge-lit type backlight unit according to an embodiment.

FIG. 3 is a cross section view illustrating a case where an electronic apparatus is applied to a display device including an edge-lit type backlight unit according to an embodiment.

As shown in FIG. 3, the display device 1 may include a display panel 10, a diffuser plate 20, a light guide plate 115, a reflective sheet 40, a case 50, a light source 60, and at least one holder 130 for supporting the diffuser plate 20 while being coupled to the light guide plate 115.

The diffuser plate 20, the light guide plate 115, the reflective sheet 40, and the case 50 are sequentially coupled to the rear of the display panel 10, the light source 60 is disposed adjacent to one of side surfaces of the light guide plate 115 to irradiate light toward one side of the light guide plate 115.

The light source 60 may include a printed circuit board (PCB) 62 extending along a longitudinal direction of the light guide plate 115 and a plurality of light emitting devices 61 disposed along the longitudinal direction of the printed circuit board 62.

The plurality of light emitting devices 61 may be composed of a light emitting diode (LED), a cold cathode fluorescent lamp (CCFL), an external electrode fluorescent lamp (EEFL), a laser diode (Laser Diode). LD), etc.

The light guide plate 115 may guide light incident from the light source 60 to the display panel 10, and convert the light incident from the light source 60 into surface light having a uniform light quantity to irradiate toward the display pane 10.

The diffuser plate 20 is disposed between the display panel 10 and the light guide plate 115.

The diffuser plate 20 may diffuse and scatter light emitted from a light output surface 31 of the light guide plate 115, and diffuse the light emitted from the light guide plate 115 along the surface such that the overall color and brightness of a screen displayed through the display panel are uniformly visible.

The light guide plate 115 may serve as the printed circuit board 110 of FIG. 1 to which the holder 130 is bonded. In other words, the holders 130 may pass through the light guide plate 115 and be bonded to one surface of the light guide plate 115 by the solder layer 150, and may be formed to protrude upward and downward from the light guide plate 115, respectively At least one holder 130 supporting the diffuser plate 20 may be disposed between the light guide plate 115 and the diffuser plate 20. Through this holder 130, the light guide plate 115 and the diffuser plate 20 may be spaced apart from each other at a predetermined interval while facing each other, and the light guide plate 115 and the diffuser plate 20 may be spaced apart from each other at a constant optical distance DL.

The holder 130 may be made of plastic, silicone, or rubber.

The diffuser plate 20 may be supported by the upper holder 135 of at least one holder 130 disposed on the light guide plate 115. Specifically, the light guide plate 115 may include at least one through-hole 113 to which the at least one holder 130 is coupled.

The plurality of through-holes 113 may be disposed radially based on the center of the light guide plate 115, and the plurality of holders 130 may be coupled to the plurality of through-holes 113 by auto-insert, respectively, and be radially disposed based on the center of the light guide plate 115.

As such, the plurality of holders 130 may be bonded on the surface of the light guide plate 115 and coupled to the light guide plate 115, such that the diffuser plate 20 may be supported by the plurality of holders 130.

The diffuser plate 20 may be formed to be relatively thin in thickness compared to its area, and be supported by the holder 130 while being spaced apart from the light guide plate 115 at regular intervals to maintain a flat state not being loosed or bent. In addition, the plurality of holders 130 for supporting the diffuser plate 20 may be coupled to the light guide plate 115 by auto-insertion to facilitate manufacture of the light guide plate 115.

The insertion protrusion 132 of the lower holder 131 may be inserted into the through-hole 113 formed in the light guide plate 115 and protrude from a lower end of the light guide plate 115. The fitting member 133 of the lower holder 131 may be fixedly coupled to a case 50 to be described below.

The case 50 is coupled to the rear portion of the display device 1.

The case 50 may be disposed at the rear of the display panel 10 to form a rear exterior and a side exterior of the display device 1, and may cover a side surface of the display panel 10.

The case 50 may include a fastening hole 51 into which the lower holder 131 including a plurality of fitting members 133 may be inserted and coupled. The plurality of fitting members 133 formed in the lower holder 131 may be fitted and combined into the fastening hole 51 of the case 50.

Figure 4:
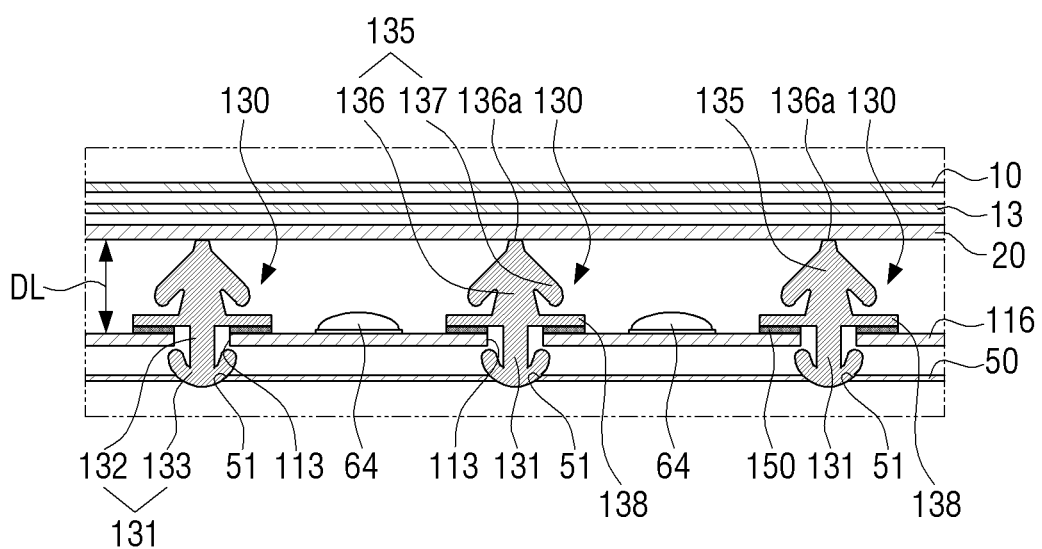
FIG. 4 is a cross section view illustrating a case where an electronic apparatus is applied to an edge-lit type display device according to an embodiment.

FIG. 4 is a cross section view illustrating a case where an electronic apparatus is applied to an edge-lit type display device according to an embodiment.

As shown in FIG. 4, a display device 2 may include a display panel 10, an optical sheet 13, a diffuser plate 20, a printed circuit board 116, a plurality of light emitting devices 64 disposed on the printed circuit board 116, and at least one holder 130 coupled to the printed circuit board 116 to support the diffuser plate 20.

A light source for providing light to the display panel 10 may include the printed circuit board 116 and the plurality of light emitting devices 64. The light source is formed to directly irradiate light onto a front surface of the display panel 10 by disposing the plurality of light emitting elements 64 under the display panel 10. The optical sheet 13, the diffuser plate 20, the printed circuit board 116, and the case 50 are sequentially combined at the rear of the display panel 10, and the light source may be formed to directly irradiate light to the front surface of the display panel 10.

The diffuser plate 20 is disposed between the display panel 10 and the printed circuit board 116 of the light source.

At least one holder 130 supporting the diffuser plate 20 may be disposed between the printed circuit board 116 and the diffuser plate 20. Through this holder 130, the printed circuit board 116 and the diffuser plate 20 may be disposed with a space at regular intervals while facing each other, and the light source and the diffuser plate 20 may be separated by a regular optical distance DL.

The diffuser plate 20 may be supported by the upper holder 135 of at least one holder 130 disposed on the printed circuit board 116 of the light source. The printed circuit board 116 of the electronic apparatus 100 described in FIG. 1 may be formed of the printed circuit board 116 of a light source.

As the lower holder 131 is inserted and coupled to the printed circuit board 116, the reflective sheet 40, and the case 50, and the connecting member 138 is bonded to one surface of the printed circuit board 116 by the solder layer 150, the holder 130 may stably support the diffuser plate 20 while being fixed to the printed circuit board 116.

The upper holder 135 protrudes from the connecting member 138 toward the diffuser plate 20. Specifically, the upper holder 135 is formed to protrude from the connecting member 138 and includes a support protrusion 136 bonding to the diffuser plate 20 and an arcuate absorbing portion 137 coupled to the support protrusion 136.

The diffuser plate 20 may be supported so as to be spaced apart from the light source at a regular optical distance DL by a support surface 136A formed on the upper end of the support protrusion 136.

The absorbing portion 137 has an arch shape, and the support protrusion 136 in the center of the absorbing portion 137 protrudes toward the diffuser plate 20. As such, the upper holder 135 may absorb external shocks applied to the diffuser plate 20 and the display panel 10.

In addition, the upper holder 135 supporting the diffuser plate 20 may be supported by the connecting member 138.

It is preferable that the connecting member 138 is configured to have a diameter larger than a diameter of the through-hole 113 so as to cover the periphery of the through-hole 113 while bonding to the printed circuit board 116. The connecting member 138 may block a part of the light emitted toward the diffuser plate 20 through the through-hole 113 and the periphery of the through-hole 113.

As such, the plurality of holders 130 are bonded on the surface of the printed circuit board 116 of the light source and coupled to the printed circuit board 116, such that the diffuser plate 20 may be supported by the plurality of holders 130.

The diffuser plate 20 may be formed to be relatively thin compared to its area, and be supported by the holder 130 while being spaced apart from the printed circuit board 116 of the light source at regular intervals to maintain a flat state not being loosed or bent. In addition, the plurality of holders 130 for supporting the diffuser plate 20 may be coupled to the printed circuit board 116 by auto-insert to facilitate manufacture of the light source.

The case 50 is coupled to the rear portion of the display device 1.

The case 50 may be disposed at the rear of the display panel 10 to form a rear exterior and a side exterior of the display device 1, and may cover a side surface of the display panel 10.

The case 50 may include a fastening hole 51 into which the lower holder 131 including the plurality of fitting members 133 may be inserted and coupled. The plurality of fitting members 133 formed in the lower holder 131 may be fitted into the fastening hole 51 of the case 50.

Meanwhile, the electronic apparatus according to the embodiment may further include a metal layer (not shown) provided under the connecting member 138. The metal layer may be formed on one surface facing the printed circuit board 116 of the connecting member 138.

The metal layer may be made of a plated conductor on the connecting member 138. The metal layer may be bonded to the solder layer 150.

In order to bond one area of the holder 130 on the upper surface of the printed circuit board 116, the solder layer 150 interposed between the holder 130 and the printed circuit board 116 may be stably bonded to a molten metal layer. Particularly, when the holder 130 is made of a plastic material, the metal layer and the solder layer 150 may allow the holder 130 to be stably bonded to the printed circuit board 116.

Figure 5:
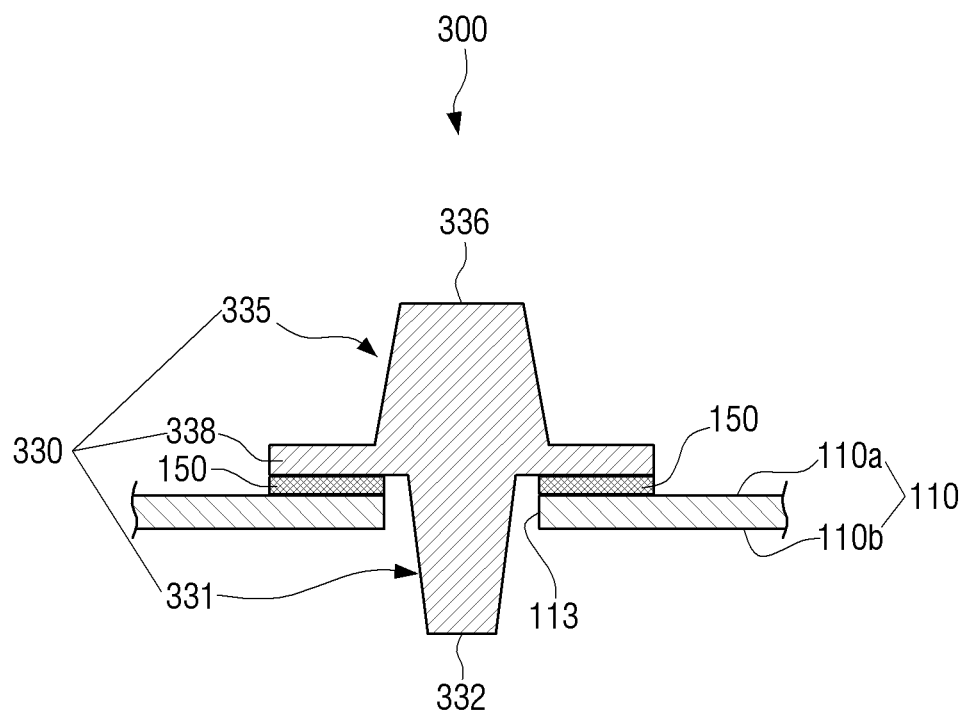
FIG. 5 is across section view illustrating an electronic apparatus according to another embodiment.

FIG. 5 is a cross section view illustrating an electronic apparatus according to another embodiment.

As shown in FIG. 5, the electronic apparatus 300 according to another embodiment may include a printed circuit board 110 and a holder 330 fixedly coupled to the printed circuit board 110. The holder 330 may be automatically inserted and fixed onto the upper surface of the printed circuit board 110 by the solder layer 150. The holder 330 includes a lower holder 331, an upper holder 335 and a connecting member 338.

However, a description overlapping with the electronic apparatus 100 according to an embodiment illustrated in FIG. 1 will be omitted, and hereinafter, the lower holder 331 and the upper holder 335 according to another embodiment of the disclosure will be described by focusing on shapes of the lower holder 331 and the upper holder 335.

The lower holder 331 may be formed to have a narrower width from the connecting member 338 toward the lower side. A first contact surface 332 for contacting other members may be formed at a lowermost end of the lower holder 331. The first contact surface 332 may be formed flat, and may be formed parallel to the printed circuit board 110.

The upper holder 335 may be formed to have a narrower width from the connecting member 338 toward the upper side. A second contact surface 336 for contacting other members may be formed at an uppermost end of the upper holder 335. The second contact surface 336 may be formed flat and may be formed parallel to the printed circuit board 110.

The lower holder 331 and the upper holder 335 may be formed to protrude downward and upward from the center of the connecting member 338, respectively. The lower holder 331 and the upper holder 335 may be formed in a conical shape symmetrical based on the connecting member 338.

Figure 6:
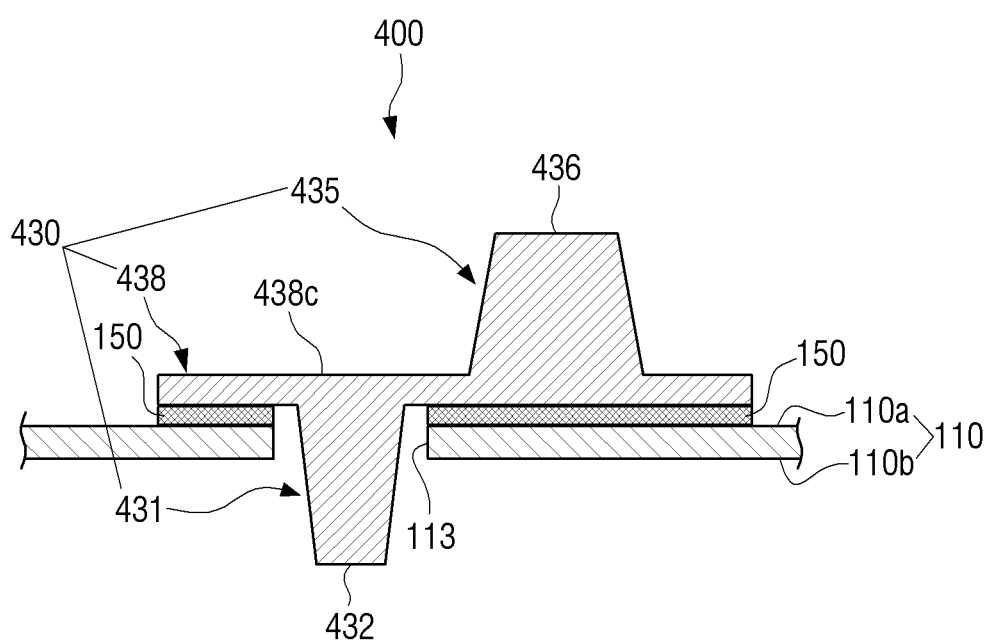
FIG. 6 is a cross section view illustrating an electronic apparatus according to another embodiment of the disclosure.

FIG. 6 is a cross section view illustrating an electronic apparatus according to another embodiment of the disclosure.

As shown in FIG. 6, the electronic apparatus 400 according to another embodiment of the disclosure may include a printed circuit board 110 and a holder 430 fixedly coupled to the printed circuit board 110. The holder 430 may be automatically inserted and fixed onto the upper surface of the printed circuit board 110 by the solder layer 150. The holder 430 includes a lower holder 431, an upper holder 435 and a connecting member 438.

However, since shapes of the lower holder 431 and the upper holder 435 are the same as the shapes of the lower holder 331 and the upper holder 335 according to the embodiment shown in FIG. 6, a duplicate description is omitted. Hereinafter, a position and function of the upper holder 435 according to another embodiment will be described.

The lower holder 431 may protrude from the connecting member 438 toward the through-hole 113. The upper holder 435 may be disposed to be spaced apart from the lower holder 431 by a predetermined distance.

When the connecting member 438 has a disk shape, the upper holder 435 and the lower holder 431 may be eccentrically disposed from the center of the connecting member 438. The upper holder 435 may be formed at a position corresponding to a contact position of a member to which the upper holder 435 contacts. As the upper holder 435 is disposed to be spaced apart from the lower holder 431, the holder 430 may support members having various contact positions.

The connecting member 438 may be extended to cover the upper holder 435 and the solder layer 150. The connecting member 438 may include a flat surface 438C formed flat on an opposite surface of the lower holder 431. In a process of fixing the holder 430 to the printed circuit board 110 by auto-insert, a transfer device for transferring the holder 430 to the printed circuit board 110 may adsorb the flat surface 438C to transfer the upper holder 430 to the through-hole 113 of the printed circuit board 110. The flat surface 438C may facilitate the transfer of the holder 430 protruding upward and downward.

Figure 7:
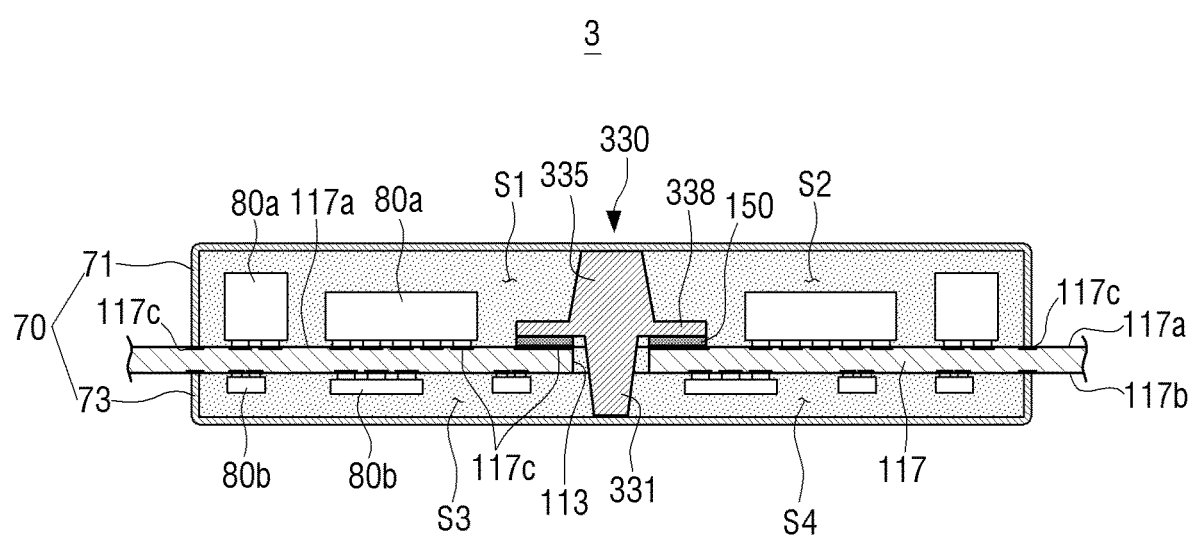
FIG. 7 is a cross section view illustrating a case where an electronic apparatus includes a shielding structure.

FIG. 7 is a cross section view illustrating a case where an electronic apparatus includes a shielding structure.

Referring to FIG. 7, the electronic apparatus may have a shielding structure 3 for electromagnetically shielding at least one electronic element 80A and 80B disposed on a first and second surfaces 117A and 117B of the printed circuit board 117.

The shielding structure 3 may be formed of a shield cover 70 and a holder 330. The shield cover 70 may include a first cover 71 provided on the printed circuit board 117 and a second cover 73 provided under the printed circuit board 117.

The first cover 71 may be formed to surround at least a portion of the electronic apparatuses 80A mounted on the first surface 117A of the printed circuit board 117. The second cover 73 may be formed to surround at least a portion of the electronic apparatuses 80B mounted on the second surface 117B of the printed circuit board 117.

The first cover 71 may include a side surface surrounding at least a portion of a space formed between the first surface 117A and the first cover 71 of the printed circuit board 117. In the same manner, the second cover 73 may include a side surface surrounding at least a portion of a space formed between the second surface 117B and the second cover 73 of the printed circuit board 117.

The shield cover 70 forming the shielding structure 3 may be mounted on the printed circuit board 117. The shield cover 70 may be electrically connected to a ground part of the printed circuit board 117. The first cover 71 and the second cover 73 may be formed of a conductive metal material such as SUS, aluminum, etc. soldered to the printed circuit board 117.

The holder 330 may be mounted on the printed circuit board 117, the upper holder 335 may be in contact with an inner surface of the first cover 71, and the lower holder 331 may be mounted on an inner surface of the second cover 73. The holder 330 may electrically connect the first cover 71 and the second cover 73.

A shielding area may be partitioned by the holder 330 and the shield cover 70. The holder 330 and the shield cover 70 may form an outer periphery of the shielding areas.

The printed circuit board 117 may have a grounding pad 117C patterned thereon. The grounding pad 117C may be formed inside the printed circuit board 117 with a top surface of the grounding pad 117C exposed so as not to protrude to the top surface of the printed circuit board 117.

The grounding pad 117C may be formed for grounding or signal transmission of a plurality of circuit elements 80A and 80B. The holder 330 may be grounded according to an arrangement path of the holder 330 on the printed circuit board 117 or in electrical contact with the grounding pad 117C formed in a part of the arrangement path of the holder 330.

A plurality of holders 330 may be provided on the printed circuit board 117. The holder 330 may form a shielding area forming a closed loop with the holder 330 adjacent to each other.

The shielding structure including the holder 330 of the electronic apparatus may form a closed loop entirely by the shield cover 70 and may partition two or more shielding areas by the holder 330. For example, a first shielding area S1 and a second shielding area S2 may form a closed loop by the first cover 71 and the upper holder 330, and a third shielding area S3 and a fourth shielding area may form a closed loop by the second cover 73 and the lower holder 330.

As described above, four shielding areas S1, S2, S3, and S4 may be partitioned by the holder 330, so there is no need a space for a gap between each shield cover, unlike a conventional shielding structure to which a shield cover is applied. Therefore, space may be omitted, and since there is no need to use a shield cover which causes an expensive material cost. the manufacturing cost of the product can be decreased. In addition, even if a design of the shielding area (e.g., an outline of the shielding area) is different, an arrangement of the holder 330 or a shape of the holder 330 may be changed to correspond to a design of the corresponding shielding area, thereby maximizing work flexibility.

The various example embodiments aforementioned were explained separately, but each of the example embodiments may not necessarily be realized separately, and the configuration and operation of each of the example embodiments may be realized in combinations with at least one other example embodiment.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims. Accordingly, such modifications, additions and substitutions should also be understood to fall within the scope of the disclosure.

What is claimed is:

1. An electronic apparatus comprising:
a printed circuit board comprising at least one through-hole;
a holder which is positioned through the through-hole and protrudes upward and downward from the printed circuit board; and
a solder layer configured to bond one area of the holder to one surface of the printed circuit board,
wherein the holder comprises:
a lower holder that passes through the through-hole to be disposed on a lower portion of the printed circuit board, and protrudes downward from the printed circuit board;
an upper holder that protrudes upward from the printed circuit board; and
a connecting member that has a width that is wider than a diameter of the through-hole and is connected the upper holder and the lower holder.

2. The electronic apparatus of claim 1, wherein the holder is configured to be inserted into the printed circuit board and fixed onto a surface of the printed circuit board.

3. The electronic apparatus of claim 1, wherein the holder further comprises one surface extended to a periphery of the through-hole to be bonded to the solder layer.

4. The electronic apparatus of claim 1, wherein the solder layer is interposed between one surface of the printed circuit board and the connecting member.

5. The electronic apparatus of claim 1, wherein the connecting member covers the solder layer formed on a periphery of the through-hole.

6. The electronic apparatus of claim 1, wherein the connecting member comprises a cover area corresponding to a size of the through-hole, and an extended area which covers a portion of the printed circuit board by being extended from the cover area, and
wherein the solder layer contacts a lower end of the extended area.

7. The electronic apparatus of claim 1, wherein the connecting member has a disk shape, and
wherein the lower holder protrudes toward the through-hole from a center of the connecting member.

8. The electronic apparatus of claim 1, wherein the upper holder is spaced apart from the lower holder passing through the through-hole by a predetermined distance.

9. The electronic apparatus of claim 1, wherein the holder is made of plastic, silicone, or rubber.

10. The electronic apparatus of claim 9, wherein the printed circuit board comprises a light guide plate disposed behind a display panel to guide the light to the display panel, and wherein the upper holder is configured to support a diffuser plate disposed between the display panel and the light guide plate.

11. The electronic apparatus of claim 1, wherein the holder is made of an electrically conductive material.

12. The electronic apparatus of claim 1, wherein the printed circuit board comprises a shield cover configured to shield electromagnetic waves of mounted electronic components, wherein the shield cover comprises a first cover provided on an upper portion of the printed circuit board, and a second cover provided on the lower portion of the printed circuit board, wherein an inner surface of the first cover contacts the upper holder, wherein an inner surface of the second cover contacts the lower holder, and wherein the holder electronically connects the first cover and the second cover.

13. The electronic apparatus of claim 12, wherein the solder layer is electronically connected to a grounding pad of the printed circuit board.

14. The electronic apparatus of claim 12, wherein the solder layer is made of conductive epoxy.

* * * * *